(12) United States Patent
Kim et al.

(10) Patent No.: US 9,966,278 B1
(45) Date of Patent: May 8, 2018

(54) STACK PACKAGES HAVING WITH CONFINED UNDERFILL FILLET AND METHODS OF MANUFACTURING THE SAME

(71) Applicant: SK hynix Inc., Icheon-si, Gyeonggi-do (KR)

(72) Inventors: Taehoon Kim, Icheon-si (KR); Hyun Kyu Ryu, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/677,339

(22) Filed: Aug. 15, 2017

(30) Foreign Application Priority Data

Feb. 16, 2017 (KR) ........................ 10-2017-0021105

(51) Int. Cl.
| | |
|---|---|
| *H01L 21/56* | (2006.01) |
| *H01L 23/00* | (2006.01) |
| *H01L 25/00* | (2006.01) |
| *H01L 25/065* | (2006.01) |
| *H01L 23/31* | (2006.01) |

(52) U.S. Cl.
CPC ........ *H01L 21/561* (2013.01); *H01L 23/3135* (2013.01); *H01L 23/562* (2013.01); *H01L 24/97* (2013.01); *H01L 25/0657* (2013.01); *H01L 25/50* (2013.01); *H01L 2225/06513* (2013.01); *H01L 2225/06541* (2013.01); *H01L 2225/06582* (2013.01)

(58) Field of Classification Search
CPC ... H01L 23/562; H01L 25/0657; H01L 25/50; H01L 2225/06513; H01L 2225/06541; H01L 2225/06582; H01L 21/561; H01L 23/3135; H01L 24/97
See application file for complete search history.

(56) References Cited

U.S. PATENT DOCUMENTS

| | | | |
|---|---|---|---|
| 2011/0244628 A1* | 10/2011 | Ode | ........... H01L 21/565 438/109 |
| 2014/0091460 A1 | 4/2014 | Lee et al. | |

* cited by examiner

*Primary Examiner* — Fei Fei Yeung Lopez
(74) *Attorney, Agent, or Firm* — William Park & Associates Ltd.

(57) ABSTRACT

There is provided a method of manufacturing a stack package. The method includes vertically stacking core dies on a base die wafer to provide a stack structure, forming partition walls on the base die wafer to surround the stack structure, and forming an underfill material layer that includes underfilling portions filling gaps between the core dies, and filling fillet portions covering side surfaces of the core dies. The fillet portions are formed to have a width confined by the partition walls. The partition walls are removed, and a mold layer is formed to cover the fillet portions. Related stack packages are also provided.

20 Claims, 11 Drawing Sheets

STACK PACKAGES HAVING WITH CONFINED UNDERFILL FILLET AND METHODS OF MANUFACTURING THE SAME

CROSS-REFERENCE TO RELATED APPLICATIONS

The present application claims priority under 35 U.S.C 119(a) to Korean Application No. 10-2017-0021105, filed on Feb. 16, 2017, which is incorporated herein by reference in its entirety.

BACKGROUND

1. Technical Field

Embodiments of the present disclosure relate to semiconductor packages and, more particularly, to stack packages having confined underfill fillets and methods of manufacturing the same.

2. Related Art

In the electronics industry, a semiconductor package technique for vertically stacking a plurality of semiconductor dies is increasingly in demand with the development of multi-functional, larger storage capacity and smaller electronic systems or products. In addition, a high bandwidth memory (HBM) solution technique is in demand to obtain a fast data transmission speed. In response to such a demand, an HBM package has been proposed. The HBM package may be realized to include a plurality of memory dies which are vertically stacked, and the plurality of stacked memory dies may be electrically connected to each other by through silicon vias (TSVs). A lot of effort has been focused on applying a chip-on-wafer process technique to realize the HBM packages. In order to employ the chip-on-wafer process technique in fabrication of the HBM packages, it may be necessary to develop methods of electrically isolating the stacked memory dies from each other and methods of overcoming warpage of base die wafers used in the fabrication of the HBM packages.

SUMMARY

According to an embodiment, there is provided a method of manufacturing stack packages. The method includes vertically stacking core dies on a base die wafer to provide a stack structure, forming partition walls on the base die wafer to surround the stack structure, and forming an underfill material layer that includes under-filling portions filling gaps between the core dies and fillet portions covering side surfaces of the core dies. The fillet portions are formed to have a width confined by the partition walls. The partition walls are removed, and a mold layer is formed to cover the fillet portions.

According to another embodiment, there is provided a method of manufacturing stack packages. The method includes forming a first stack structure and a second stack structure side-by-side on a base die wafer. Each of the first and second stack structures is formed to include a plurality of core dies which are vertically stacked. A lattice structure is formed on the base die wafer to provide a first cavity and a second cavity in which the first and second stack structures are respectively inserted. The lattice structure is comprised of partition walls. An underfill material is dispensed into the first and second cavities to form an underfill material layer including under-filling portions filling gaps between the core dies, and filling fillet portions covering side surfaces of the core dies. The fillet portions are formed to have a width confined by the lattice structure. The lattice structure is removed to provide a trench. A mold layer filling the trench is formed.

According to yet another embodiment, a stack package includes a stack structure, an underfill material layer, and a mold layer. The stack structure includes a plurality of core dies vertically stacked on a base die. The underfill material layer includes under-filling portions filling gaps between the core dies, and filling fillet portions covering side surfaces of the core dies. Each of the fillet portions has an outer side surface exhibiting a vertical profile. The mold layer covers the fillet portions and has outer side surfaces that exhibit a vertical profile.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
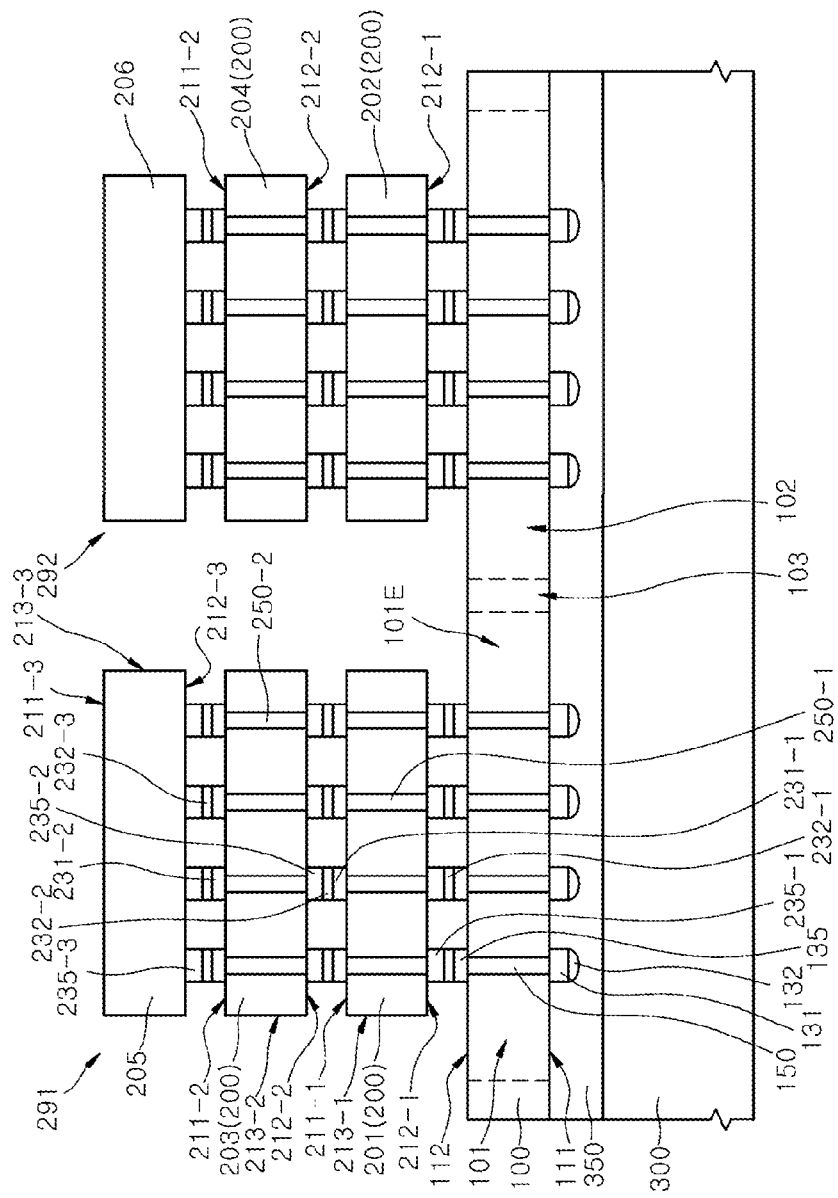
FIGS. 1 to 9 illustrate a method of manufacturing stack packages according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms first, second, third etc. may be used herein to describe various elements, these elements should not be limited by these terms. These terms are only used to distinguish one element from another element, but not used to define only the element itself or to mean a particular sequence.

Semiconductor packages according to the following embodiments may correspond to stack packages including a plurality of semiconductor dies or a plurality of semiconductor chips which are vertically stacked. The separate semiconductor dies or the separate semiconductor chips may be obtained by separating a semiconductor substrate such as a semiconductor wafer including electronic circuits into a plurality of pieces (having semiconductor die shapes or semiconductor chip shapes) using a die sawing process. Each of the semiconductor dies may include a through silicon via (TSV) structure. The TSV structure may correspond to an interconnection structure including a plurality of through electrodes or a plurality of through vias that vertically penetrate each semiconductor die. The semiconductor dies may correspond to memory dies such as dynamic random access memory (DRAM) dies, static random access memory (SRAM) dies, flash memory dies, magnetic random access memory (MRAM) dies, resistive random access memory (ReRAM) dies, ferroelectric random access memory (FeRAM) dies, or phase change random access memory (PcRAM) dies. The semiconductor dies or the semiconductor packages may be employed in communication systems such as mobile phones, electronic systems associated with biotechnology or health care, or wearable electronic systems.

The stack package according to an embodiment may be an HBM package. The HBM package may include an HBM interface to improve a data transmission speed between the HBM package and a processor chip. The HBM interface of the HBM package may be realized using a TSV input/output (I/O) unit including a plurality of TSVs. A processor chip supported with an operation of the HBM package may be an application specific integrated circuit (ASIC) chip including a central processing unit (CPU) or a graphics processing unit (GPU), a microprocessor or a microcontroller, an application processor (AP), a digital signal processing core, and an interface.

The same reference numerals refer to the same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating core dies 200 stacked on a wafer 100 having base die regions 101 and 102.

Referring to FIG. 1, the wafer or base die wafer 100 including the base die regions 101 and 102 may be attached to a carrier 300 using a temporary adhesive 350. Each of the base die regions 101 and 102 may be a semiconductor die region in which an integrated circuit constituting a first semiconductor device is integrated. The wafer 100 may be a semiconductor substrate in which a plurality of semiconductor die regions are arrayed. The first base die region 101 and the second base die region 102 adjacent to the first base die region 101 may be physically connected to each other by an intermediate region 103. The intermediate region 103 may include a scribe lane. The first and second base die regions 101 and 102 may be separated from each other by cutting or sawing the wafer 100 along the scribe lane to provide first and second base dies which are separated.

The wafer 100 may have a first surface 111 and a second surface 112 which are opposite to each other. The first surface 111 of the wafer 100 may correspond to a bottom surface of the wafer 100, and the second surface 112 of the wafer 100 may correspond to a top surface of the wafer 100.

First connection terminals 131 may be disposed on the first surface 111 of the wafer 100 to electrically connect the base dies to external devices. Second connection terminals 135 may be disposed on the second surface 112 of the wafer 100 to electrically connect the base dies to the core dies 200. The first connection terminals 131 may denote connection terminals that are disposed on a surface which is distinct from a surface on which the second connection terminals 135 are disposed. The first connection terminals 131 may be electrically connected to the second connection terminals 135 by first through vias 150 that substantially penetrate the first base die region 101. The first through vias 150 may be formed of TSVs substantially penetrating the wafer 100 to electrically connect the first connection terminals 131 to the second connection terminals 135. The first and second connection terminals 131 and 135 may be disposed to overlap and to be aligned with the first through vias 150. The first connection terminals 131 may be disposed to overlap with the second connection terminals 135 when viewed from a plan view.

The first connection terminals 131 may be bumps protruding from the first surface 111 of the wafer 100 and including a copper material. A first conductive adhesive layer 132 may be disposed on ends of the first connection terminals 131 opposite to the second connection terminals 135, and the first conductive adhesive layer 132 may be formed to include a solder layer. The solder layer used in formation of the first conductive adhesive layer 132 may include an alloy layer of tin (Sn) and silver (Ag). In addition, a barrier layer such as a nickel layer may be disposed between each of the first connection terminals 131 formed of copper bumps and the first conductive adhesive layer 132 formed of a solder layer corresponding to a Sn—Ag alloy layer. Each of the first connection terminals 131 may be formed to have a diameter of about several tens of micrometers and a height of about several tens of micrometers, and the first connection terminals 131 may be arrayed to have a pitch of about several tens of micrometers. Similarly, each of the second connection terminals 135 may be formed to have a diameter of about several tens of micrometers and a height of about several tens of micrometers, and the second connection terminals 135 may be arrayed to have a pitch of about several tens of micrometers. The second connection terminals 135 may be bumps protruding from the second surface 112 of the wafer 100 and including a copper material.

A thickness of the wafer 100 corresponding to a distance between the first and second surfaces 111 and 112 may be set to be very thin. The carrier 300 which is thicker than the wafer 100 may be attached to the first surface 111 of the wafer 100 using the temporary adhesive 350 to handle the wafer 100 in subsequent processes. The carrier 300 may be loaded on a supporter (not shown) such as a chuck of an apparatus while a subsequent process is performed using the apparatus. The carrier 300 may include a quartz wafer or a silicon wafer. The temporary adhesive 350 may include an adhesive component that fixes the wafer 100 to the carrier 300. The wafer 100 may be attached to the carrier 300 so that the first connection terminals 131 are embedded in the temporary adhesive 350.

The core dies 200 may be stacked on the wafer 100. Integrated circuits constituting second semiconductor devices may be realized on semiconductor die regions of a semiconductor substrate, and the semiconductor substrate may be cut to separate the semiconductor die regions of the semiconductor substrate from each other to provide the core dies 200 which are separated from each other. The second semiconductor devices integrated in the core dies 200 may have a function which is different from a function of the first semiconductor devices integrated in the first and second base die regions 101 and 102 of the wafer 100. For example, the second semiconductor devices integrated in the core dies 200 may be memory devices, and each of the first semiconductor devices integrated in the first and second base die regions 101 and 102 may include a controller that controls operations of the memory devices. If the stack package according to an embodiment is an HBM package, the second semiconductor devices of the core dies 200 may be dynamic random access memory (DRAM) devices including memory banks in which data is stored, and each of the first semiconductor devices formed in the first and second base die regions 101 and 102 may include a test circuit for testing various characteristics of the DRAM devices formed in the core dies 200, a soft repairing circuit, an address circuit, a command circuit, and/or a physical layer for signal transmission.

The core dies 200 may be vertically stacked on the wafer 100. A core die 201 among the core dies 200 may be stacked on the first base die region 101 of the wafer 100, and a core die 202 among the core dies 200 may be stacked on the second base die region 102 of the wafer 100. The core die 201 and the core die 202 may be disposed side-by-side on the second surface 112 of the wafer 100. The core die 201 and the core die 202 may be semiconductor dies having substantially the same configuration.

Each of the core dies 201 and 202 may have a third surface 212-1 that faces the second surface 112 of the wafer 100 and may include third connection terminals 235-1 which are disposed on the third surface 212-1 of the first core die 201 to face the second connection terminals 135 located on the second surface 112 of the wafer 100. The third connection terminals 235-1 may be bumps which are arrayed to overlap with the second connection terminals 135. The core dies 201 and 202 may be disposed side-by-side on the wafer 100 so that the third connection terminals 235-1 are respectively bonded to the second connection terminals 135.

The core dies 201 and 202 may be combined with the wafer 100 using a die bonding manner corresponding to a mass reflow manner while the third connection terminals 235-1 are respectively bonded to the second connection terminals 135. For example, after the core dies 201 and 202 are disposed on the wafer 100, a reflow process may be performed to bond the third connection terminals 235-1 of the core dies 201 and 202 to the second connection terminals 135 of the wafer 100. In such a case, the third connection terminals 235-1 may be respectively bonded to the second connection terminals 135 by a second conductive adhesive layer 232-1 provided between the third connection terminals 235-1 and the second connection terminals 135. The second conductive adhesive layer 232-1 may include a solder layer. In some embodiments, three of more core dies including the first and second core dies 201 and 202 may be simultaneously bonded to the wafer 100. In such a case, the throughput of the stacking process of the core dies may be enhanced.

The first core die 201 may have a width which is less than a width of the first base die region 101, and the second core die 202 may also have a width which is less than a width of the second base die region 102. The first core die 201 may be located to cover a central portion of the first base die region 101 and to leave exposed edge regions 101E of the first base die region 101.

Each of the first and second core dies 201 and 202 stacked at a first level on the wafer 100 may have a fourth surface 211-1 corresponding to a top surface which is opposite to the third surface 212-1 corresponding to a bottom surface. The third surface 212-1 and the fourth surface 211-1 of each of the first and second core dies 201 and 202 may be connected to each other by first sidewalls 213-1 which are vertical surfaces. Each of the core dies 201 and 202 stacked at a first level may include fourth connection terminals 231-1 disposed on the fourth surface 211-1 thereof. In each of the core dies 201 and 202, the fourth connection terminals 231-1 may be electrically connected to the third connection terminals 235-1 by second through vias 250-1 vertically penetrating the core die 201 or 202. Further, the wafer 100 may include the first through vias 150 which may be electrically connected to the second through dies 250-1.

A core die 203 and a core die 204 may be simultaneously stacked at a second level on the core die 201 and the core die 202, respectively. The core die 201 and the core die 203 disposed in a first column may be semiconductor dies having substantially the same shape and function. Similarly, the core die 202 and the core die 204 disposed in a second column may be semiconductor dies having substantially the same shape and function.

Each of the core dies 203 and 204 may have a fifth surface 212-2 facing the fourth surface 211-1 of the core die 201 or 202 and a sixth surface 211-2 which is opposite to the fifth surface 212-2, and the fifth surface 212-2 and the sixth surface 211-2 of each of the core dies 203 and 204 may be connected to each other by second sidewalls 213-2 which are vertical surfaces. Each of the core dies 203 and 204 may include fifth connection terminals 235-2 which are disposed on the fifth surface 212-2 to face the fourth connection terminals 231-1 of the core die 201 or 202. The fifth connection terminals 235-2 may be bumps which are arrayed to overlap with the fourth connection terminals 231-1.

The core dies 203 and 204 may be simultaneously and respectively combined with the core dies 201 and 202 using mass reflow so that the fifth connection terminals 235-2 are bonded to the fourth connection terminals 231-1. For example, after the core dies 203 and 204 are respectively disposed on the core dies 201 and 202, a reflow process may be performed to bond the fifth connection terminals 235-2 to the fourth connection terminals 231-1 using a third conductive adhesive layer 232-2. The third conductive adhesive layer 232-2 may include a solder layer.

The core dies 203 and 204 may be stacked on the core dies 201 and 202 so that the second sidewalls 213-2 of the core dies 203 and 204 are vertically aligned with the first sidewalls 213-1 of the core dies 201 and 202. Sixth connection terminals 231-2 may be formed on the sixth surfaces 211-2 of the core dies 203 and 204 opposite to the core dies 201 and 202. The sixth connection terminals 231-2 may be formed of bumps. The sixth connection terminals 231-2 may be electrically connected to the fifth connection terminals 235-2 by third through vias 250-2 vertically penetrating the core dies 203 and 204.

A core die 205 and a core die 206 may be simultaneously stacked on a third level on the core die 203 and the core die 204, respectively. Thus, the core dies 201, 203, and 205 overlapping with the first base die region 101 of the wafer 100 may constitute a first stack structure 291, and the core dies 202, 204, and 206 overlapping with the second base die region 102 of the wafer 100 may constitute a second stack structure 292. The core die 205 may correspond to a topmost die of the first stack structure 291, and the core die 206 may correspond to a topmost die of the second stack structure 292. In some embodiments, each of the first and second stack structures 291 and 292 may include four or more core dies which are vertically stacked.

Each of the core dies 205 and 206 may have a seventh surface 212-3 facing the sixth surface 211-2 of the core die 203 or 204, and an eighth surface 211-3 which is opposite to the seventh surface 212-3. The seventh surface 212-3 and the eighth surface 211-3 of each of the core dies 205 and 206 may be connected to each other by third sidewalls 213-3 which are vertical surfaces. Each of the core dies 205 and 206 may include seventh connection terminals 235-3 which are disposed on the seventh surface 212-3 to face the sixth connection terminals 231-2 of the core die 203 or 204. The seventh connection terminals 235-3 may be bumps which are arrayed to overlap with the sixth connection terminals 231-2.

The core dies 205 and 206 may be simultaneously and respectively combined with the core dies 203 and 204 using mass reflow so that the seventh connection terminals 235-3 are bonded to the sixth connection terminals 231-2. The seventh connection terminals 235-3 may be bonded to the sixth connection terminals 231-2 using a fourth conductive adhesive layer 232-3. The fourth conductive adhesive layer 232-3 may include a solder layer.

The core dies 205 and 206 may be stacked on the core dies 203 and 204 so that the third sidewalls 213-3 of the core dies 205 and 206 are vertically aligned with the second sidewalls 213-2 of the core dies 203 and 204. No connection terminals may be formed on the eighth surfaces 211-3 of the core dies 205 and 206 opposite to the core dies 203 and 204. Accordingly, no through vias may be included in the core dies 205 and 206. The core dies 205 and 206 corresponding to topmost dies of the first and second stack structures 291 and 292 may have the same shape and dimension as the core dies 201, 202, 203, and 204 thereunder. However, in some embodiments, the core dies 205 and 206 corresponding to topmost dies of the first and second stack structures 291 and 292 may have a thickness which is greater than a thickness of the core dies 201, 202, 203, and 204 which are located under the topmost dies. The core dies 201, 203, and 205 stacked in the first column to constitute the first stack structure 291 and the core dies 202, 204, and 206 stacked in the second column to constitute the second stack structure 292 may correspond to the second semiconductor devices having the same function.

In an embodiment, after all of the core dies 201, 202, 203, 204, 205, and 206 are stacked on the wafer 100, a thermal reflow process may be performed once to bond the core dies 201, 202, 203, 204, 205, and 206 and the wafer to each other. In such a case, a flux material may be used in temporary bonding between the wafer 100 and the core dies 201 and 202 disposed at the first level, between the core dies 201 and 202 disposed at the first level and the core dies 203 and 204 disposed at the second level, and between the core dies 203 and 204 disposed at the second level and the core dies 205 and 206 disposed at the third level. The flux material may provide an adhesive strength for temporary bonding between the solder bumps attached to the connection terminals of the wafer 100 and the core dies 200. Temporary bonding between the solder bumps may be achieved by a tensile force. Accordingly, the core dies 200 may be easily aligned with the wafer 100. The flux material between the wafer 100 and the core dies 200 may be removed by a cleaning process performed after the thermal reflow process. According to an embodiment, the thermal reflow process may be performed once after all of the core dies 200 are stacked on the wafer 100. Thus, the thermal burden on the wafer 100 and the core dies 200 may be reduced to prevent degradation of the reliability of the package.

Because all of the core dies 200 stacked on the wafer 100 are simultaneously bonded to each other using a mass reflow process, a process time necessary for fabrication of the package may be reduced. In addition, according to an embodiment, the connection terminals of the core dies 200 may be directly bonded to each other without using a non-conductive film (NCF) to build the first and second stack structures 291 and 292 on the wafer 100. Thus, it may be possible to prevent the core dies 200, the wafer 100 and the connection terminals 131, 135, 231-1, 235-1, 231-2, 235-2, 231-3, and 235-3 from being damaged by over compression force.

Figure 2:
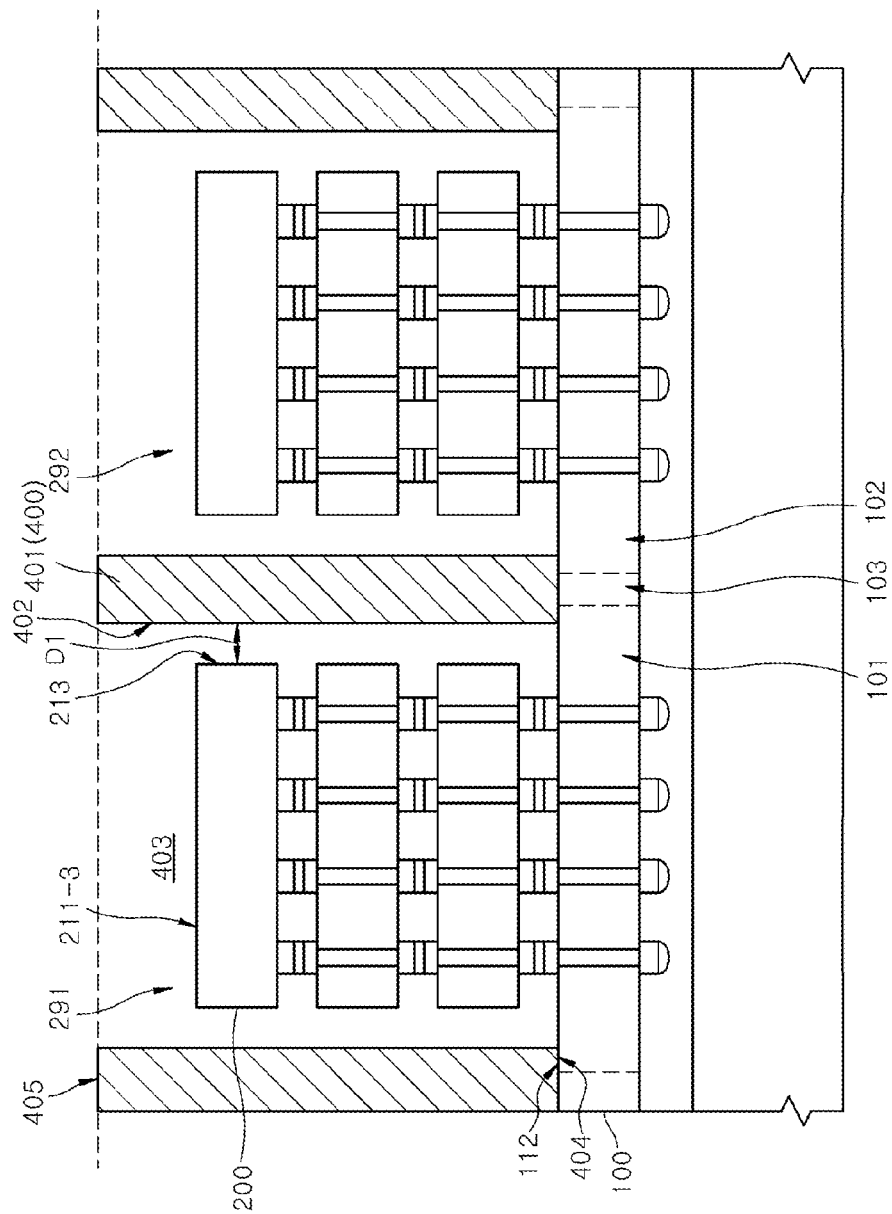
Figure 3:
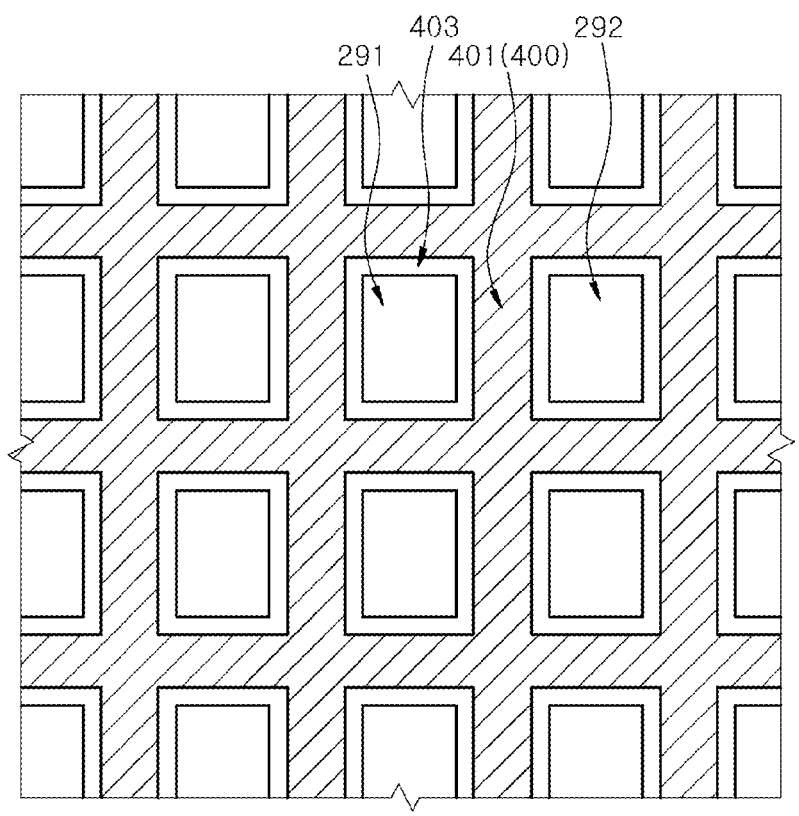

FIG. 2 is a cross-sectional view illustrating a step of forming a lattice of partition walls 400 on the wafer 100, and FIG. 3 is a plan view illustrating the lattice of partition walls 400 illustrated in FIG. 2.

Referring to FIGS. 2 and 3, the lattice of partition walls 400 may be formed on the wafer 100. The lattice of partition walls 400 may include a plurality of partition walls 401 which are connected to each other to provide cavities 403, each of which accommodates any one of the stack structures such as the stack structures 291 and 292. Vertical inner side surfaces of the partition walls 401 may be formed on the wafer 100 to face and surround sidewalls of each of the stack structures 291 and 292. The partition walls 401 providing the cavities 403 may be formed so that bottom surfaces 404 of the partition walls 401 are in contact with the second surface 112 of the wafer 100. The partition walls 401 may be formed to have a lattice structure that provides the cavities 403 when viewed from a plan view. Each of the cavities 403 may have a tetragonal shape or a rectangular shape in a plan view. The lattice structure 400 comprised of the partition walls 400 may be formed so that each of the stack structures 291 and 292 is inserted into any one of the cavities 403.

The lattice structure 400 may be formed so that side surfaces 402 of the partition walls 401 are spaced apart from the sidewalls 213 of the core dies 200 by a distance D1. The partition walls 401 may be formed so that the distance D1 is equal to or less than a certain value. The partition walls 401 may be formed to overlap with a scribe lane corresponding to the intermediate region 103 of the wafer 100 when viewed from a plan view. The partition walls 401 may be formed so that top surfaces 405 of the partition walls 401 are located at a level which is higher than the eighth surfaces 211-3 of the topmost dies 205 and 206 of the core dies 200 of the stack structures 291 and 292. The partition walls 401 may be formed of a material which gives a side surface (i.e., the side surface 402) a relatively low surface energy. For example, the partition walls 401 may be formed of a Teflon™ (a trademark of DuPont company) material. The partition walls 401 may be formed to have inner side surfaces 402 which exhibit a vertical profile.

Figure 4:
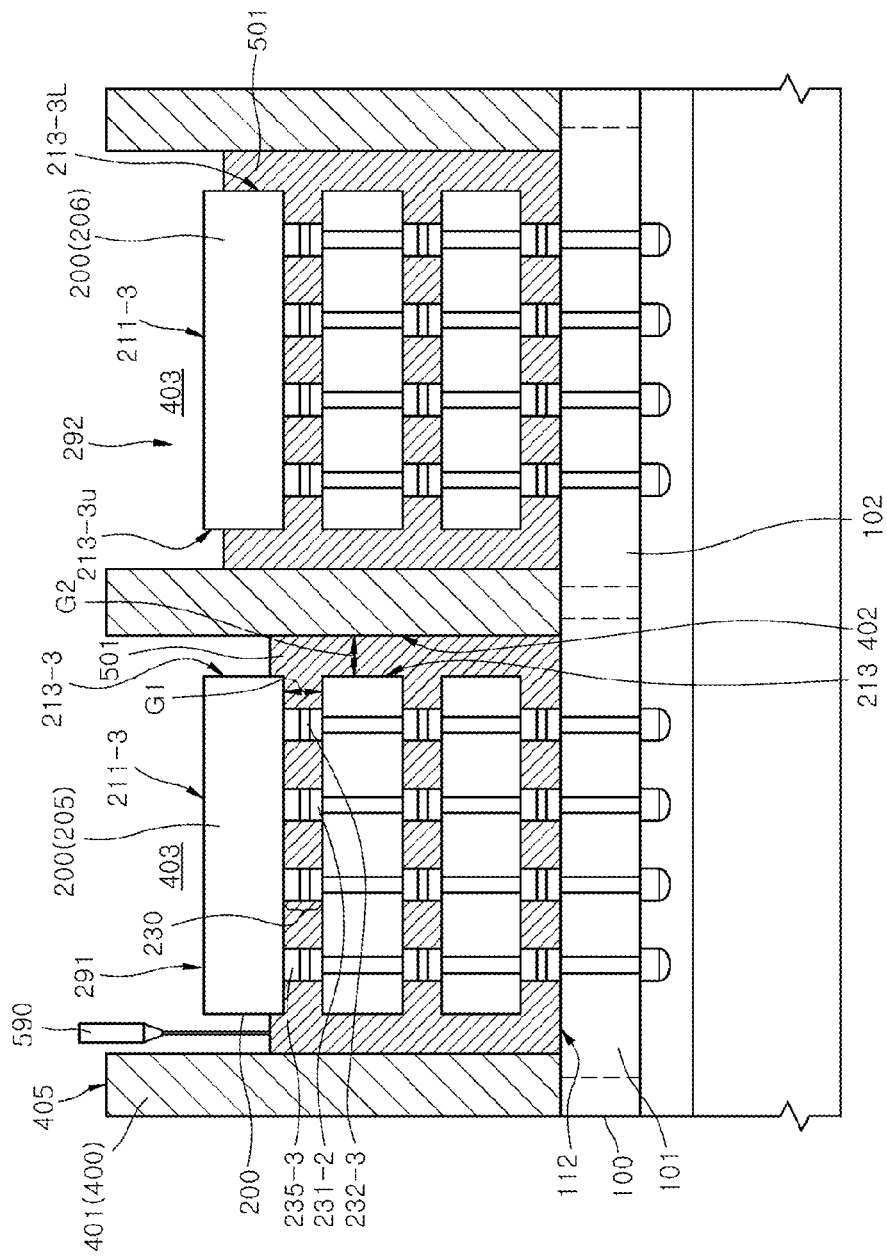

FIG. 4 is a cross-sectional view illustrating a step of dispensing an underfill material 501 into the cavities 403 defined by the partition walls 401.

Referring to FIG. 4, the underfill material 501 may be dispensed into the cavities 403 using a dispenser 590 to cover the second surface 112 of the wafer 100 and to fill first gaps G1 between the core dies 200 in each cavity 403. The underfill material 501 may be dispensed to first fill second gaps G2 between the sidewalls 213 of the core dies 200 and the side surfaces 402 of the partition walls 401, and the first gaps G1 may be filled with the underfill material 501 by a capillary phenomenon. That is, the dispensed underfill material 501 may flow and move into the first gaps G1 by a capillary phenomenon. The underfill material 501 filling the first gaps G1 may surround bonded structures 230 formed between the core dies 200 stacked in each cavity 403 to electrically insulate the bonded structures 230 from each other. One of the bonded structures 230 may include, for example, the sixth connection terminal 231-2 and the seventh connection terminal 235-3 which are bonded to each other by the fourth conductive adhesive layer 232-3.

If the number of the bonded structures 230 between the core dies 200 increases, a distance between the bonded structures 230 may be reduced to be about several tens of micrometers. In such a case, a viscosity of the underfill material 501 should be low in order to fully fill the first gaps G1 with the underfill material 501. The underfill material 501 may include a resin component such as silicone resin or epoxy resin. The underfill material 501 may be obtained by dispersing fillers in a resin material. A viscosity of the underfill material 501 may be controlled by changing a type of the resin component, a content of the resin component, or a ratio of the resin component. Alternatively, a viscosity of the underfill material 501 may also be controlled by changing a size or a content of the fillers contained in the underfill material 501.

If the underfill material 501 is dispensed into the cavities 403, the second gaps G2 between the core dies 200 and the partition walls 401 may be first filled with the underfill material 501. The underfill material 501 filling the second gaps G2 may be in contact with the sidewalls 213 of the core dies 200 and the side surfaces 402 of the partition walls 401. The underfill material 501 may be dispensed to leave the eighth surfaces 211-3 of the core dies 205 and 206 exposed. The underfill material 501 may be dispensed so that upper portions 213-3U of the third sidewalls 213-3 of the core dies 205 and 206 corresponding to the topmost dies of the first and second stack structures 291 and 292 remain exposed, and lower portions 213-3L of the third sidewalls 213-3 of the core dies 205 and 206 corresponding to the topmost dies are covered. According to the embodiments, the underfill material 501 may be dispensed to cover the eighth surfaces 211-3 of the core dies 205 and 206 corresponding to the topmost dies.

Figure 5:
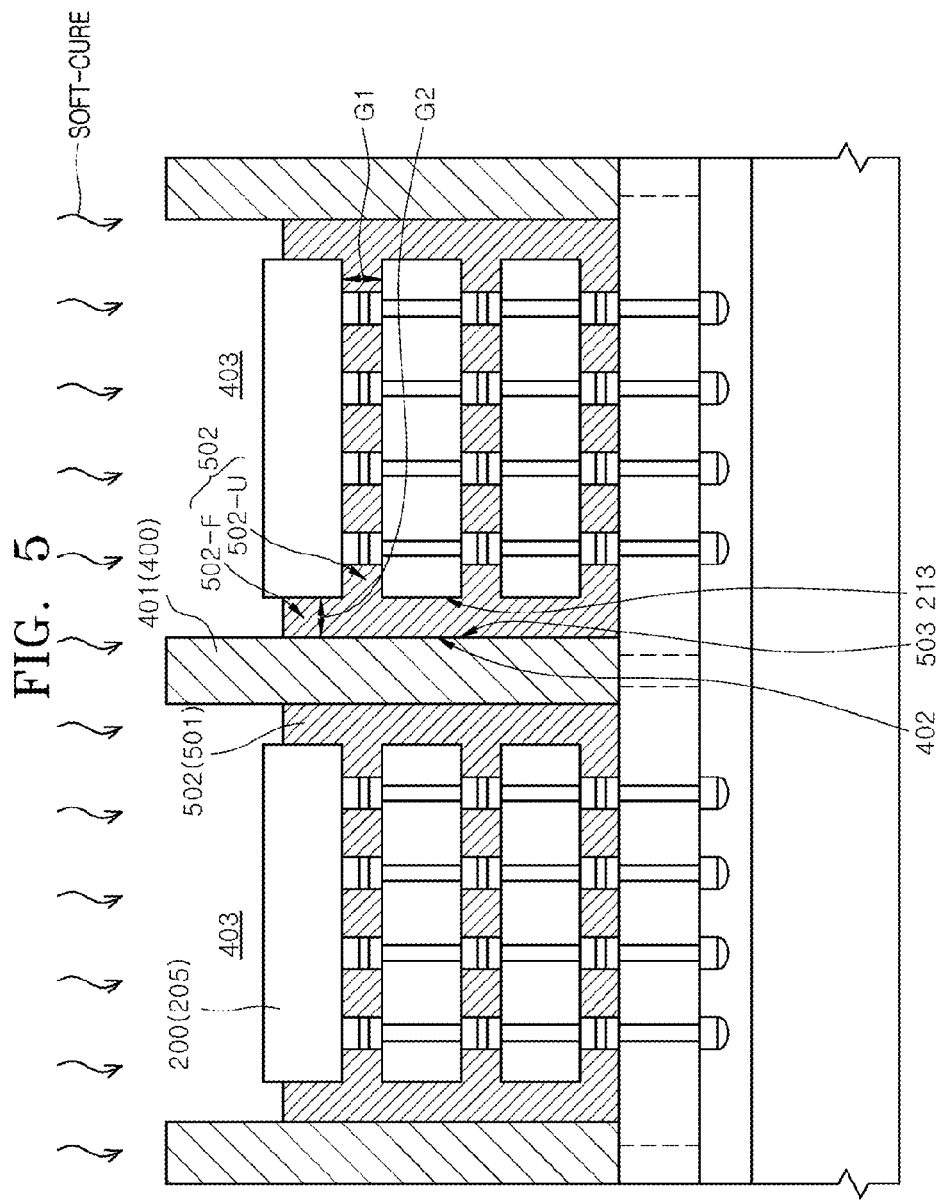

FIG. 5 is a cross-sectional view illustrating a step of soft-curing the underfill material 501.

Referring to FIG. 5, the underfill material 501 may be soft-cured to form an underfill material layer 502. Because the underfill material 501 has a liquid state, the underfill material 501 may be soft-cured to obtain the underfill material layer 502 which is hardened. In such a case, the underfill material 501 may be partially cured to provide the underfill material layer 502.

While the underfill material 501 is soft-cured, the underfill material 501 may be hardened in the cavities 403. That is, the lattice structure 400 may act as a mold frame or a template during the soft-curing process. Accordingly, fillet shaped portions 502-F of the underfill material layer 502 filling the second gaps G2 between the lattice structure 400 and the core dies 200 may be defined by the partition walls 401. The fillet portions 502-F of the underfill material 502 may be in contact with vertical inner side surfaces 402 of the partition walls 401 while the underfill material 501 is soft-cured. Thus, the fillet portions 502-F may be molded to have vertical side surfaces 503. Further, underfill material 501 may be dispensed so that the fillet portions 502-F of the underfill material layer 502 may cover lower portions of the sidewalls of the topmost core die(s) 205 and 206.

Because the underfill material 501 has a liquid state with a low viscosity, the underfill material 501 may laterally spread out while the underfill material 501 is dispensed onto the core dies 200 if the partition walls 401 are not provided. In such a case, after the underfill material 501 is soft-cured to form the underfill material layer 502, a width of the fillet portions 502-F may increase to increase a volume ratio of the fillet portions 502-F to the underfill material layer 502. However, according to the embodiment, the partition walls 401 may prevent the underfill material 501 from being laterally spread out while the underfill material 501 is dispensed into the cavities 403. Thus, the fillet portions 502-F may be formed to have substantially the same width as the second gaps G2 due to the presence of the partition walls 401. As a result, a volume ratio of the fillet portions 502-F to under-filling portions 502-U of the underfill material layer 502 filling the first gaps G1 may be efficiently reduced. That is, a volume ratio of the fillet portions 502-F to an entire portion of the underfill material layer 502 may be reduced. In addition, the fillet portions 502-F may be formed to have a uniform and narrow width because of the presence of the partition walls 401.

Figure 6:
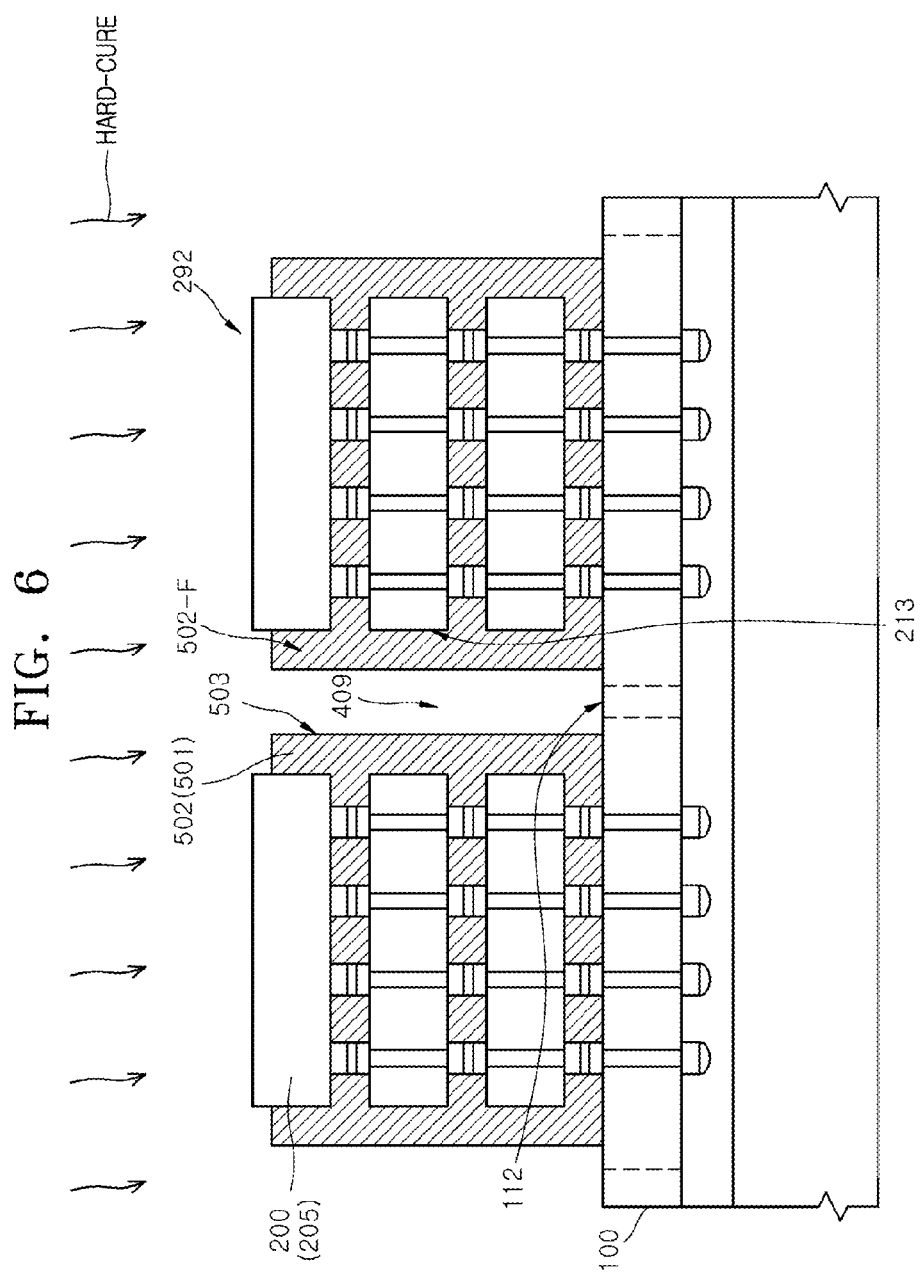

FIG. 6 is a cross-sectional view illustrating a step of hard-curing the underfill material layer 502.

Referring to FIG. 6, the lattice structure (400 of FIG. 5) may be separated and removed from the underfill material layer 502. Because the lattice structure 400 is formed of a material having a relatively low surface energy such as a Teflon™ material, the lattice structure 400 may be readily separated from the underfill material layer 502. In some embodiments, the lattice structure 400 may be provided with a release layer (not shown) coated on the side surfaces (402 of FIG. 5) of the lattice structure 400 in order to more readily separate the lattice structure 400 from the underfill material layer 502. The release layer may include an anti-adhesive component such as wax. In addition, the underfill material 501 may also include an anti-adhesive component such as wax so that the lattice structure 400 is more readily separated from the underfill material layer 502 formed by soft-curing the underfill material 501.

If the lattice structure 400 is separated and removed from the underfill material layer 502, the side surfaces 503 of the fillet portions 502-F of the underfill material layer 502 may be exposed to provide a trench 409 between the side surfaces 503 of the fillet portions 502-F. A portion of the second surface 112 of the wafer 100 may be exposed by the trench 409 to correspond to a bottom surface of the trench 409. The side surfaces 503 of the fillet portions 502-F may correspond to side surfaces of the trench 409. Accordingly, the side surfaces of the trench 409 may also have a vertical profile.

If the lattice structure 400 is not provided, the underfill material 501 having a liquid state may be laterally spread out while the underfill material 501 is dispensed onto the core dies 200. In such a case, a width of the fillet portions 502-F may increase, as described above. However, according to the embodiment, the fillet portions 502-F may be formed to have a predetermined width with the vertical side surfaces 503 due to the presence of the lattice structure 400.

After the lattice structure 400 is removed, a hard-curing process may be performed to further harden the underfill material layer 502. The hard-curing process may correspond to a second curing process for additionally baking the underfill material layer 502 which is soft-cured. The hard-curing process may correspond to a thermal treatment process like the soft-curing process. An annealing temperature of the hard-curing process may depend on composition of the underfill material layer 502. The hard-curing process may be performed at a temperature which is higher than a temperature at which the soft-curing process is performed.

Because the underfill material layer 502 is baked by the hard-curing process corresponding to the second curing process, portions of the underfill material layer 502 which are not cured during the soft-curing process may be cured during the hard-curing process. Accordingly, the underfill material layer 502 may be further hardened by the hard-curing process. Thus, it may be possible to prevent the underfill material layer 502 from thermally shrinking or expanding in a subsequent thermal process, for example, a molding process. The thermal shrinkage or the thermal expansion of the underfill material layer 502 may cause warpage of the wafer 100. The hard-curing process corresponding to the second curing process may be performed to suppress the warpage of the wafer 100.

Figure 7:
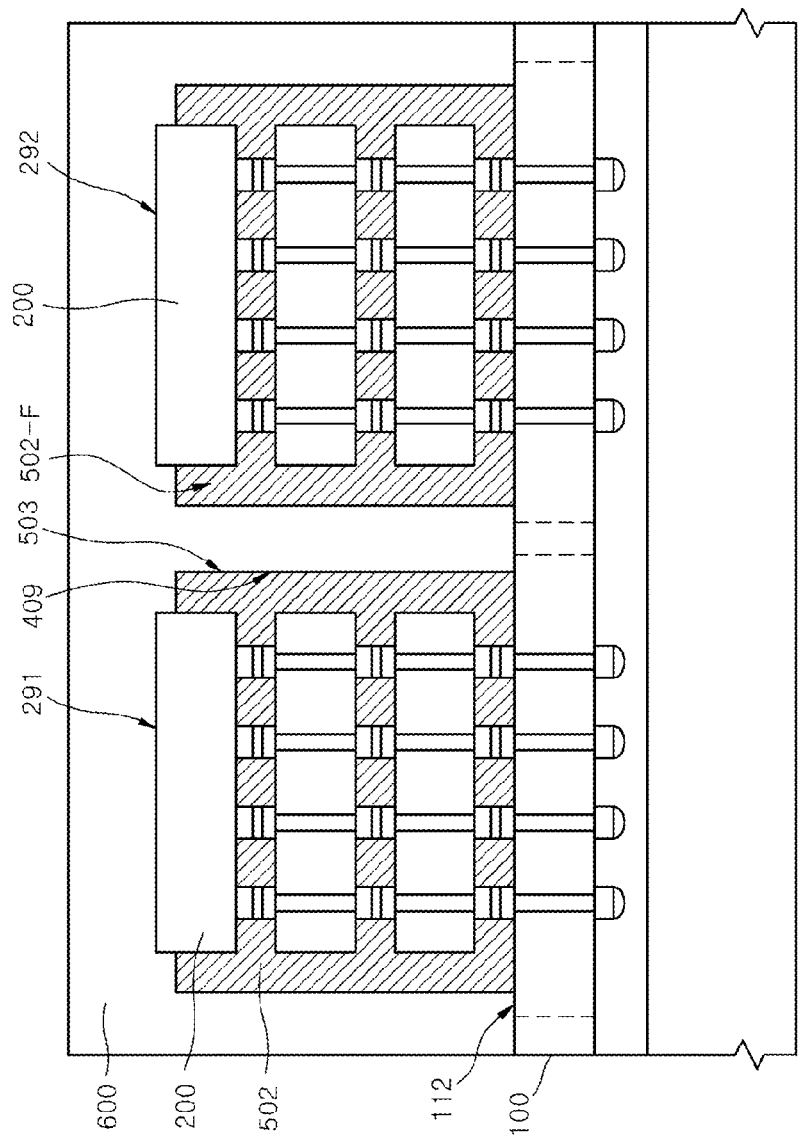

FIG. 7 is a cross-sectional view illustrating a step of forming a mold layer 600.

Referring to FIG. 7, the mold layer 600 may be formed on the wafer 100 to cover the underfill material layer 502. The mold layer 600 may fill the trench 409 to cover exposed portions of the second surface 112 of the wafer 100. A plasma treatment process may be applied to an exposed surface of the underfill material layer 502 before the mold layer 600 is formed. If the plasma treatment process is applied to the exposed surface of the underfill material layer 502, a surface energy of the underfill material layer 502 may increase. Accordingly, the plasma treatment process may increase an adhesive strength between the underfill material layer 502 and the mold layer 600.

The mold layer 600 may be formed to cover the stack structures 291 and 292 stacked on the wafer 100. Accordingly, the mold layer 600 may function as an encapsulant that protects the stack structures 291 and 292. The mold layer 600 may be formed of a molding material such as an epoxy molding compound (EMC) material. The molding material may include an epoxy material and fillers dispersed in the epoxy material.

A content of fillers in the underfill material (501 of FIG. 4) may be lower than that of the fillers in the mold layer 600, or no fillers are included in the underfill material 501. Thus, the underfill material layer 502 may have a thermal expansion coefficient which is higher than a thermal expansion coefficient of the mold layer 600. Accordingly, it may be necessary to lower a volume ratio of the underfill material layer 502 to the mold layer 600 to suppress warpage of the wafer 100. According to the embodiment, because the fillet portions 502-F of the underfill material layer 502 are formed to have a confined width and a confined volume due to the presence of the lattice structure 400, a volume ratio of the fillet portions 502-F to the mold layer 600 may be reduced. As a result, the thermal shrinkage and thermal expansion of the fillet portions 502-F may be suppressed to prevent warpage of the wafer 100 during the molding process.

A first portion of the underfill material layer 502 covering the side surfaces of the first stack structure 291 may be separated from a second portion of the underfill material layer 502 covering the side surfaces of the second stack structure 292 adjacent to the first stack structure 291 by the trench 409. Thus, even though at least one of the first and second portions of the underfill material layer 502 is thermally shrunk or expanded during the molding process, the thermal shrinkage or the thermal expansion of the underfill material layer 502 may possibly not affect the other stack structures adjacent to the first and second stack structures 291 and 292 due to the presence of the trench 409 between the stack structures. As a result, warpage of the wafer 100 may be more effectively suppressed during the molding process.

Figure 8:
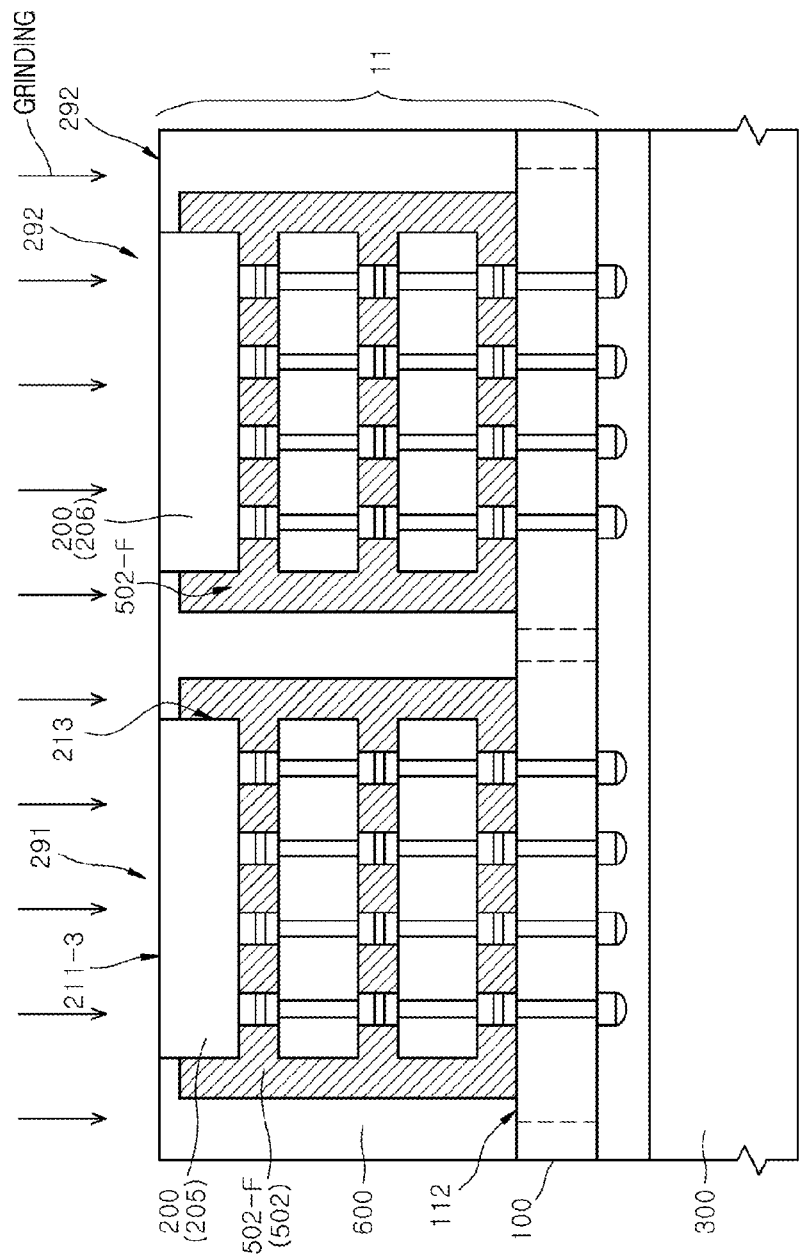

FIG. 8 is a cross-sectional view illustrating a step of removing a portion of the mold layer 600.

Referring to FIG. 8, an upper portion of the mold layer 600 may be removed to expose the eighth surfaces 211-3 of the topmost dies 200 (i.e., the core dies 205 and 206). Each of the stack structures 291 and 292 may include the plurality of core dies 200 which are vertically stacked. Thus, the heat generated by the plurality of core dies 200 in each stack structure 291 or 292 may degrade the performance of the stack structure 291 or 292. Accordingly, the eighth surfaces 211-3 of the topmost dies 200 (i.e., the core dies 205 and 206) may be exposed to emit the heat generated by the plurality of core dies 200.

The upper portion of the mold layer 600 may be removed using a grinding process to expose the eighth surfaces 211-3 of the topmost dies 200 (i.e., the core dies 205 and 206). Thus, after the grinding process is performed, the mold layer 600 may have a side mold form covering only the side surfaces of the stack structures 291 and 292. That is, the final mold layer 600 may be formed to fill only the trench 409 between the stack structures. If the upper portion of the mold layer 600 is removed, the sidewalls 213 of the stack structures 291 and 292 stacked on the wafer 100 may be surrounded by the fillet portions 502-F of the underfill material layer 502 and the mold layer 600 to provide a stack package structure 11.

Figure 9:
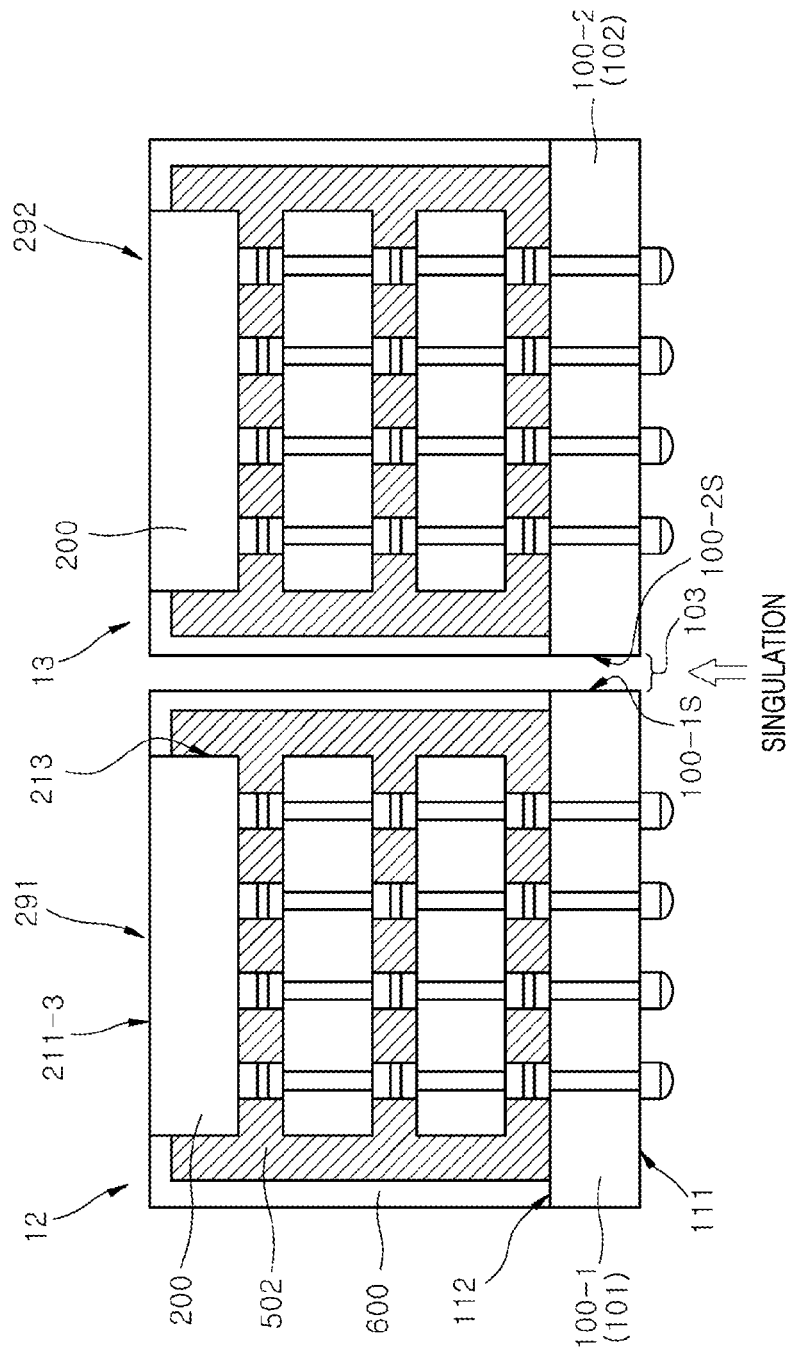

FIG. 9 is a cross-sectional view illustrating a step of separating the stack package structure 11 into a first stack package 12 and a second stack package 13.

Referring to FIG. 9, the stack package structure 11 may be detached from the carrier (300 of FIG. 8). The stack package structure 11 may be electrically tested, and a singulation process may be performed to separate the stack package structure 11 into the first stack package 12 and the second stack package 13. The singulation process may be achieved using a die sawing process. The die sawing process may be performed by cutting the wafer 100 along the intermediate region 103 corresponding to a scribe lane. As a result of the die sawing process, a first base die 100-1 in the first base die region 101 may also be separated from a second base die 100-2 in the second base die region 102, and a side surface 100-1S of the first base die 100-1 may face a side surface 100-2S of the second base die 100-2. The first stack package 12 may be separated from the second stack package 13 to include the first stack structure 291 comprised of the core dies 200 stacked on the first base die 100-1 using a bump bonding process, the underfill material layer 502 covering the sidewalls 213 of the first stack structure 291, and the mold layer 600 surrounding outer sidewalls of the underfill material layer 502. The second stack package 13 may also have substantially the same configuration as the first stack package 12.

Figure 10:
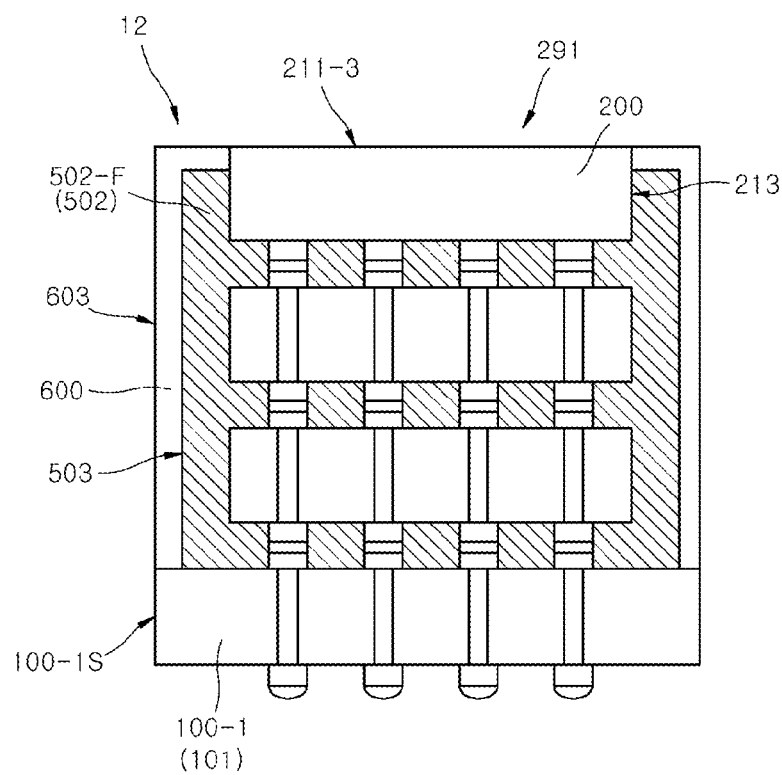
FIG. 10 is a cross-sectional view illustrating a stack package according to an embodiment.

FIG. 10 is a cross-sectional view illustrating the first stack package 12 shown in FIG. 9.

Referring to FIG. 10, the first stack package 12 may include the first stack structure 291 comprised of the core dies 200 stacked on the first base die 100-1, the underfill material layer 502 covering the sidewalls 213 of the first stack structure 291, and the mold layer 600 surrounding outer sidewalls of the underfill material layer 502. The underfill material layer 502 may extend to fill spaces between the core dies 200 vertically stacked and a space between the first stack structure 291 and the first base die 100-1 and may have the fillet portions 502-F which are extended to cover the sidewalls 213 of the first stack structure 291. The fillet portions 502-F of the underfill material layer 502 may have side surfaces 503 that substantially exhibit a vertical profile. The mold layer 600 covering the fillet portions 502-F of the underfill material layer 502 and exposed portions of the sidewalls 213 of the first stack structure 291 may have side surfaces 603 that substantially exhibit a vertical profile. The side surfaces 603 of the mold layer 600 may be vertically aligned with the side surfaces 100-1S of the first base die 100-1, respectively. The side surfaces 100-1S of the first base die 100-1 may be left exposed by the mold layer 600. That is, the side surfaces 100-1S of the first base die 100-1 may possibly not be covered with the mold layer 600. The mold layer 600 may possibly not cover the eighth surface 211-3 of the topmost die 200. That is, the eighth surface 211-3 corresponding to a top surface of the first stack structure 291 may be left exposed by the mold layer 600.

According to the embodiment described above, the lattice structure 400 may be introduced to confine a shape of the fillet portions 502-F while a capillary underfill process is performed to form the underfill material 501. Thus, the fillet portions 502-F of the underfill material layer 502 may be formed to have side surfaces 503 exhibiting a vertical profile. Accordingly, a volume ratio of the fillet portions 502-F to the mold layer 600 may be lowered to suppress the warpage of the wafer 100.

Figure 11:
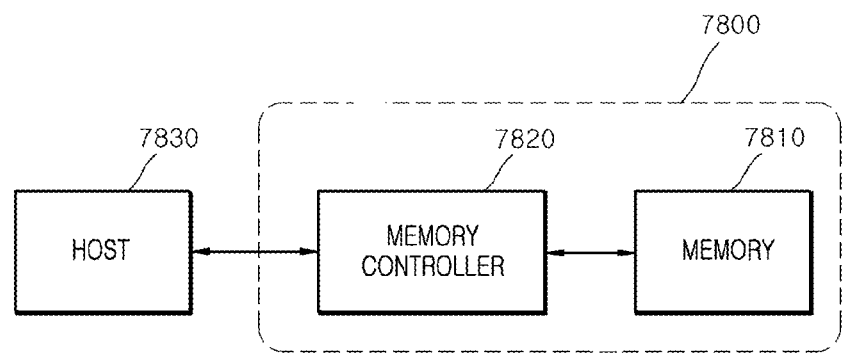
FIG. 11 is a block diagram illustrating an electronic system employing a memory card including a stack package according to an embodiment.

FIG. 11 is a block diagram illustrating an electronic system including a memory card 7800 including at least one stack package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 may include at least one of the stack packages manufactured according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
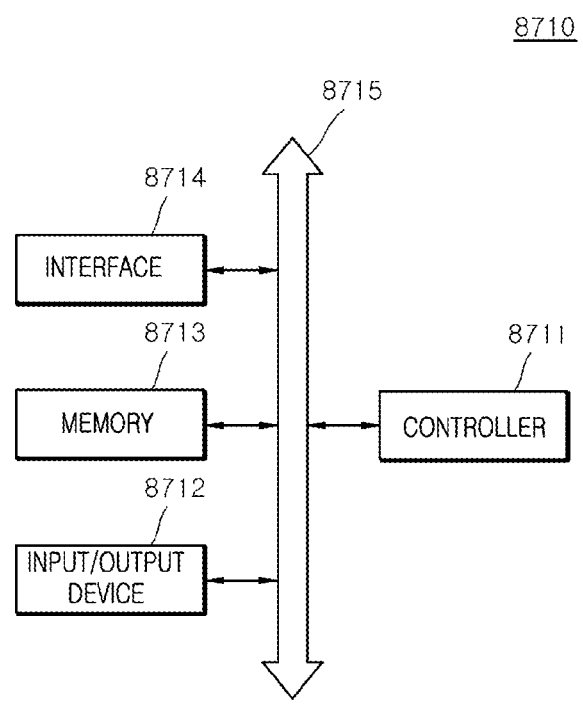
FIG. 12 is a block diagram illustrating an electronic system including a stack packages according to an embodiment.

FIG. 12 is a block diagram illustrating an electronic system 8710 including at least one stack package according to an embodiment. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communication, the electronic system 8710 may be used in a communication system such as a CDMA (code division multiple access), GSM (global system for mobile communications), NADC (north American digital cellular), E-TDMA (enhanced-time division multiple access), WCDAM (wideband code division multiple access), CDMA2000, LTE (long term evolution), and Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A method of manufacturing a stack package, the method comprising:
   vertically stacking core dies on a base die wafer to provide a stack structure;
   forming partition walls on the base die wafer to surround the stack structure;
   forming an underfill material layer that includes underfilling portions filling gaps between the core dies, and filling fillet portions covering side surfaces of the core dies, wherein the fillet portions are formed to have a width confined by the partition walls;
   removing the partition walls; and
   forming a mold layer that covers the fillet portions.

2. The method of claim 1,
   wherein the partition walls are formed to have inner side surfaces exhibiting a vertical profile; and
   wherein the inner side surfaces of the partition walls face sidewalls of the stack structure.

3. The method of claim 2, wherein the fillet portions of the underfill material layer are in contact with the vertical inner side surfaces of the partition walls to have vertical side surfaces.

4. The method of claim 2, wherein the partition walls are formed so that top surfaces of the partition walls are located at a level which is higher than a top surface of the stack structure.

5. The method of claim 1, wherein forming the underfill material layer includes:
   dispensing an underfill material into a space between the partition walls and the stack structure; and
   curing the underfill material dispensed into the space between the partition walls and the stack structure.

6. The method of claim 5, further comprising additionally curing the underfill material layer after the partition walls are removed.

7. The method of claim 5, wherein the underfill material is dispensed so that the fillet portions of the underfill material layer cover lower portions of the sidewalls of the topmost core die of the stack structure and leave exposed upper portions of the sidewalls of the topmost core die of the stack structure.

8. The method of claim 1, wherein forming the mold layer includes:
   forming a preliminary mold layer on the base die wafer to cover the stack structure; and
   removing an upper portion of the preliminary mold layer to expose a top surface of the topmost core die of the stack structure.

9. The method of claim 1, wherein the core dies are stacked on the base die wafer using a bump bonding process.

10. The method of claim 9,
wherein the core dies include a topmost core die;
wherein each of the core dies under the topmost core die includes first through vias to be electrically connected to the base die wafer; and
wherein the base die wafer includes second through vias to be electrically connected to the first through vias.

11. A method of manufacturing stack packages, the method comprising:
forming a first stack structure and a second stack structure side-by-side on a base die wafer, wherein each of the first and second stack structures is formed to include a plurality of core dies which are vertically stacked;
forming a lattice structure on the base die wafer to provide a first cavity and a second cavity in which the first and second stack structures are respectively inserted, wherein the lattice structure is comprised of partition walls;
dispensing an underfill material into the first and second cavities to form an underfill material layer including under-filling portions filling gaps between the core dies, and filling fillet portions covering side surfaces of the core dies, wherein the fillet portions are formed to have a width confined by the lattice structure;
removing the lattice structure to provide a trench; and
forming a mold layer filling the trench.

12. The method of claim 11,
wherein the partition walls are formed to have side surfaces exhibiting a vertical profile; and
wherein the lattice structure is formed to surround sidewalls of the first and second stack structures so that the vertical side surfaces of the partition walls face the sidewalls of the first and second stack structures.

13. The method of claim 12, wherein the fillet portions of the underfill material layer are in contact with the vertical side surfaces of the partition walls to have vertical side surfaces.

14. The method of claim 12, wherein the lattice structure is formed so that a top surface of the lattice structure is located at a level which is higher than top surfaces of the first and second stack structures.

15. The method of claim 11, wherein forming the underfill material layer includes curing the underfill material dispensed into the first and second cavities.

16. The method of claim 15, further comprising additionally curing the underfill material layer after the partition walls constituting the lattice structure are removed.

17. The method of claim 15, wherein the underfill material is dispensed so that the fillet portions of the underfill material layer cover lower portions of the sidewalls of the topmost core dies of the first and second stack structures and leave exposed upper portions of the sidewalls of the topmost core dies of the first and second stack structures.

18. The method of claim 11, wherein forming the mold layer includes:
forming a preliminary mold layer on the base die wafer to cover the first and second stack structures; and
removing an upper portion of the preliminary mold layer to expose top surfaces of the topmost core dies of the first and second stack structures.

19. The method of claim 11, wherein forming the first and second stack structures includes:
stacking a first one and a second one among the core dies on a first base die region and a second base die region of the base die wafer, respectively;
bonding the first and second core dies to the first and second base die regions of the base die wafer using a bump bonding process;
stacking a third one and a fourth one among the core dies on the first core die and the second core die, respectively; and
bonding the third and fourth core dies to the first and second core dies using a bump bonding process.

20. The method of claim 19,
wherein the first core die includes first through vias to be electrically connected to the first base die region; and
wherein the first base die region includes second through vias to be electrically connected to the first through vias.

* * * * *